(12) United States Patent
Bao et al.

(10) Patent No.: US 9,863,057 B2
(45) Date of Patent: Jan. 9, 2018

(54) COATED SUBSTRATE APPARATUS AND METHOD

(71) Applicant: The Board of Trustees of the Leland Stanford Junior University, Palo Alto, CA (US)

(72) Inventors: Zhenan Bao, Stanford, CA (US); Ying Diao, Stanford, CA (US); Stefan Christian Bernhardt Mannsfeld, Palo Alto, CA (US); Chee-Keong Tee, Stanford, CA (US); Hector A. Becerril-Garcia, Rexburg, ID (US); Yan Zhou, Stanford, CA (US)

(73) Assignee: The Board of Trustees of the Leland Stanford Junior University, Stanford, CA (US)

( * ) Notice: Subject to any disclaimer, the term of this patent is extended or adjusted under 35 U.S.C. 154(b) by 594 days.

(21) Appl. No.: 14/263,864

(22) Filed: Apr. 28, 2014

(65) Prior Publication Data
US 2014/0318440 A1    Oct. 30, 2014

Related U.S. Application Data

(60) Provisional application No. 61/816,532, filed on Apr. 26, 2013.

(51) Int. Cl.
C30B 7/02      (2006.01)
C30B 29/54    (2006.01)

(52) U.S. Cl.
CPC ............... *C30B 7/02* (2013.01); *C30B 29/54* (2013.01)

(58) Field of Classification Search
CPC combination set(s) only.
See application file for complete search history.

(56) References Cited

U.S. PATENT DOCUMENTS

| | | | |
|---|---|---|---|
| 2005/0253137 A1* | 11/2005 | Whang | B82Y 10/00 257/40 |
| 2006/0060840 A1* | 3/2006 | Hanna | H01L 51/0004 257/40 |
| 2010/0127269 A1* | 5/2010 | Daniel | H01L 29/1606 257/66 |

OTHER PUBLICATIONS

Deegan, R. D. et al. Capillary flow as the cause of ring stains from dried liquid drops. Nature 389, 827-829 (1997).
Hara, A. & Sasaki, N. Use of necked-down areas to control nucleation site and direction of solidification of polycrystalline silicon using excimer laser crystallization. Journal of Applied Physics 88, 3349-3353 (2000). Abstract Only.
Podzrov et al. "Single-Crystal Organic Field Effect Transistors with the Hole Mobility ~ 8 cm 2/Vs", Appl. Phys. Lett. 83, 3504, 2003.

(Continued)

*Primary Examiner* — Duy Deo
*Assistant Examiner* — Erin Bergner
(74) *Attorney, Agent, or Firm* — Crawford Maunu PLLC

(57) ABSTRACT

A coated substrate is formed with aligned objects such as small molecules, macromolecules and nanoscale particulates, such as inorganic, organic or inorganic/organic hybrid materials. In accordance with one or more embodiments, an apparatus or method involves an applicator having at least one surface patterned with protruded or indented features, and a coated substrate including a solution-based layer of objects having features and morphology attributes arranged as a function of the protruded or indented features.

20 Claims, 6 Drawing Sheets

(56) References Cited

OTHER PUBLICATIONS

Alba-Simionesco, C. et al. Confinement of molecular liquids: Consequences on thermodynamic, static and dynamical properties of benzene and toluene. European Physical Journal E 12, 19-28 (2003).

Podzrov et al., "Intrinsic Charge Transport on the Surface of Organic Semiconductors" Phys. Rev. Lett 93, 086602, 2004.

Ha, J. M., Wolf, J. H., Hillmyer, M. A. & Ward, M. D. Polymorph selectivity under nanoscopic confinement. Journal of the American Chemical Society 126, 3382-3383 (2004). Abstract Only.

Pisula, W. et al. A zone-casting technique for device fabrication of field-effect transistors based on discotic hexa-peri-hexabenzoeoronene. Advanced Materials 17, 684-+, (2005).

Briseno et al., "High-Performance Organic Single-Crystal Transistors on Flexible Substrates", Adv. Mater. 2006.

Chen, J., Anthony, J. & Martin, D. C. Thermally induced solid-state phase transition of bis(triisopropylsilylethynyl) pentacene crystals. Journal of Physical Chemistry B 110, 16397-16403 (2006). Abstract Only.

Briseno, A. L. et al., "Patterning organic single-crystal transistor arrays." Nature 444, 913-917 (2006).

Liu, S. et al. Selective crystallization of organic semiconductors on patterned templates of carbon nanotubes. Advanced Functional Materials 17, 2891-2896 (2007). Abstract Only.

Reese, C. & Bao, Z. Organic single-crystal field-effect transistors. Materials Today 10, 20-27 (2007).

Gundlach, D. J. et al. Contact-induced crystallinity for high-performance soluble acene-based transistors and circuits. Nature Materials 7, 216-221 (2008).

Becerril, H. A., Roberts, M. E., Liu, Z., Locklin, J. & Bao, Z. High-performance organic thinfilm transistors through solution-sheared deposition of small-molecule organic semiconductors. Advanced Materials 20, 2588-+, (2008). Abstract Only.

Headrick, R. L., Wo, S., Sansoz, F. & Anthony, J. E. Anisotropic mobility in large grain size solution processed organic semiconductor thin films. Applied Physics Letters 92 (2008).

Uemura, T., Hirose, Y., Uno, M., Takimiya, K. & Takeya, J. Very High Mobility in Solution-Processed Organic Thin-Film Transistors of Highly Ordered 1 Benzothieno 3,2-b benzothiophene Derivatives. Applied Physics Express 2, (2009). Abstract Only.

Chen, J., Tee, C. K., Shtein, M., Martin, D. C. & Anthony, J. Controlled solution deposition and systematic study of charge-transport anisotropy in single crystal and single-crystal textured TIPS pentacene thin films. Organic Electronics 10, 696-703 (2009). Abstract Only.

Sele, C. W. et al. Controlled Deposition of Highly Ordered Soluble Acene Thin Films: Effect of Morphology and Crystal Orientation on Transistor Performance. Advanced Materials 21, 4926-+, (2009). Abstract Only.

Rivnay, J. et al. Large modulation of carrier transport by grain-boundary molecular packing and microstructure in organic thin films. Nature Materials 8, 952-958 (2009). Abstract Only.

Li, L. et al. Controllable Growth and Field-Effect Property of Monolayer to Multilayer Microstripes of an Organic Semiconductor. Journal of the American Chemical Society 132, 8807-+ (2010).

Giri, G. et al. Tuning charge transport in solution-sheared organic semiconductors using lattice strain. Nature 480, 504-U124 (2011).

Minemawari, H. et al. Inkjet printing of single-crystal films. Nature 475, 364-367 (2011).

Mannsfeld, S. C. B., Tang, M. L. & Bao, Z. Thin Film Structure of Triisopropylsilylethynyl-Functionalized Pentacene and Tetraceno 2,3-b thiophene from Grazing Incidence X-Ray Diffraction. Advanced Materials 23 (2011). Abstract Only.

Rogowski, et al, "Solution Processing of Semiconducting Organic Molecules for Tailored Charge Transport Properties." JPCC, 115 (23), pp. 11758-11762, 2011. Abstract Only.

Diao, Y. et al. Gel-Induced Selective Crystallization of Polymorphs. Journal of the American Chemical Society 134, 673-684 (2012).

Li, H. et al. High-Mobility Field-Effect Transistors from Large-Area Solution-Grown Aligned C-60 Single Crystals. Journal of the American Chemical Society 134, 2760-2765 (2012). Abstract Only.

Li, H. et al. High-Performance Transistors and Complementary Inverters Based on Solution-Grown Aligned Organic Single-Crystals. Advanced Materials 24, 2588-2591 (2012). Abstract Only.

Wo, S., Headrick, R. L. & Anthony, J. E. Fabrication and characterization of controllable grain boundary arrays in solution-processed small molecule organic semiconductor films. Journal of Applied Physics 111 (2012).

Goto, O. et al. Organic Single-Crystal Arrays from Solution-Phase Growth Using Micropattern with Nucleation Control Region. Advanced Materials 24, 1117-1122 (2012). Abstract Only.

Rivnay, J., Mannsfeld, S. C. B., Miller, C. E., Salleo, A. & Toney, M. F. Quantitative Determination of Organic Semiconductor Microstructure from the Molecular to Device Scale. Chemical Reviews, (2012). Table of Contents.

\* cited by examiner

COATED SUBSTRATE APPARATUS AND METHOD

FEDERALLY SPONSORED RESEARCH OR DEVELOPMENT

This invention was made with Government support under contract DE-AC02-76SF00515 awarded by the Department of Energy and under contract 0705687 awarded by the National Science Foundation. The Government has certain rights in this invention.

FIELD

Aspects of various embodiments are directed to thin film coatings, their application and both related apparatuses and methods.

BACKGROUND

Solution coating of organic semiconductors can be utilized for achieving low-cost manufacturing of electronics. Frequently, the electronics require a large-area of coverage while maintaining flexibility. In order to achieve low-cost manufacturing of these types of electronics, rapid coating speed is preferred. However, industrial-scale production poses challenges to the control of thin film morphology.

Controlling thin film morphology during solution shearing can be difficult in light of crystal defects that can form during application of the film. Solution shearing features of a film impose mass transport limitations during the coating process, which can lead to void formation and dendritic growth. This can hinder efficient charge transport due to charge carrier trapping at the prevalent grain boundaries. The transport limitation is not unique to solution shearing, but is commonly observed in other fast coating methods. These and other matters have presented challenges to coating substrates for a variety of applications

SUMMARY

Various example embodiments are directed to thin film coatings, their application and both related apparatuses and methods as well as implementation thereof.

According to an example embodiment, an apparatus includes an applicator having at least one surface patterned with protruded or indented features, and a coated substrate including a solution-based layer of objects having a plurality of features and morphology attributes (nano-sized, micron-sized, millimeter-sized or molecule level) that are attained as a function of the protruded or indented features.

Another embodiment is directed to a method as follows. The effect of patterns is characterized when a coating is generated using an applicator having at least one surface patterned with protruded or indented features. The characterizing is modeled based upon at least one attribute corresponding to the protruded or indented features, including shape, height, thickness, distance separating the protruded or indented features, and randomness of location of the protruded or indented features. Based on the characterizing, the applicator having the at least one surface patterned with protruded or indented features is used to generate the patterns in a solution of crystal-forming molecules on a substrate. In some implementations, the applicator is used to direct or align crystalline morphology attributes of the crystal-forming molecules as a function of the protruded or indented features. In other implementations, characterizing the effect of patterns includes characterizing the effect of an interconnected network having two-dimensional or three-dimensional features.

Another embodiment is directed to a method as follows. A substrate is coated with a solution-based layer of objects. An applicator having at least one surface patterned with protruded or indented features is used to control features and morphology attributes (nano-sized, micron-sized, millimeter-sized or molecule level) of the objects with the protruded or indented features. In some implementations, the features and morphology attributes are set using shape and distances between the protruded or indented features to control the flow of fluid in the solution-based layer to orient the objects. Further, patterned features on the substrate may be used to control nucleation of crystalline structures from the objects by controlling the evaporation of solvent from the solution-based layer. In some implementations, components are reacted during deposition or post deposition of the solution-based film while using the applicator to coat the film.

The above discussion/summary is not intended to describe each embodiment or every implementation of the present disclosure. The figures and detailed description that follow also exemplify various embodiments.

DESCRIPTION OF THE FIGURES

Various example embodiments may be more completely understood in consideration of the following detailed description in connection with the accompanying drawings, in which.

Figure 1:
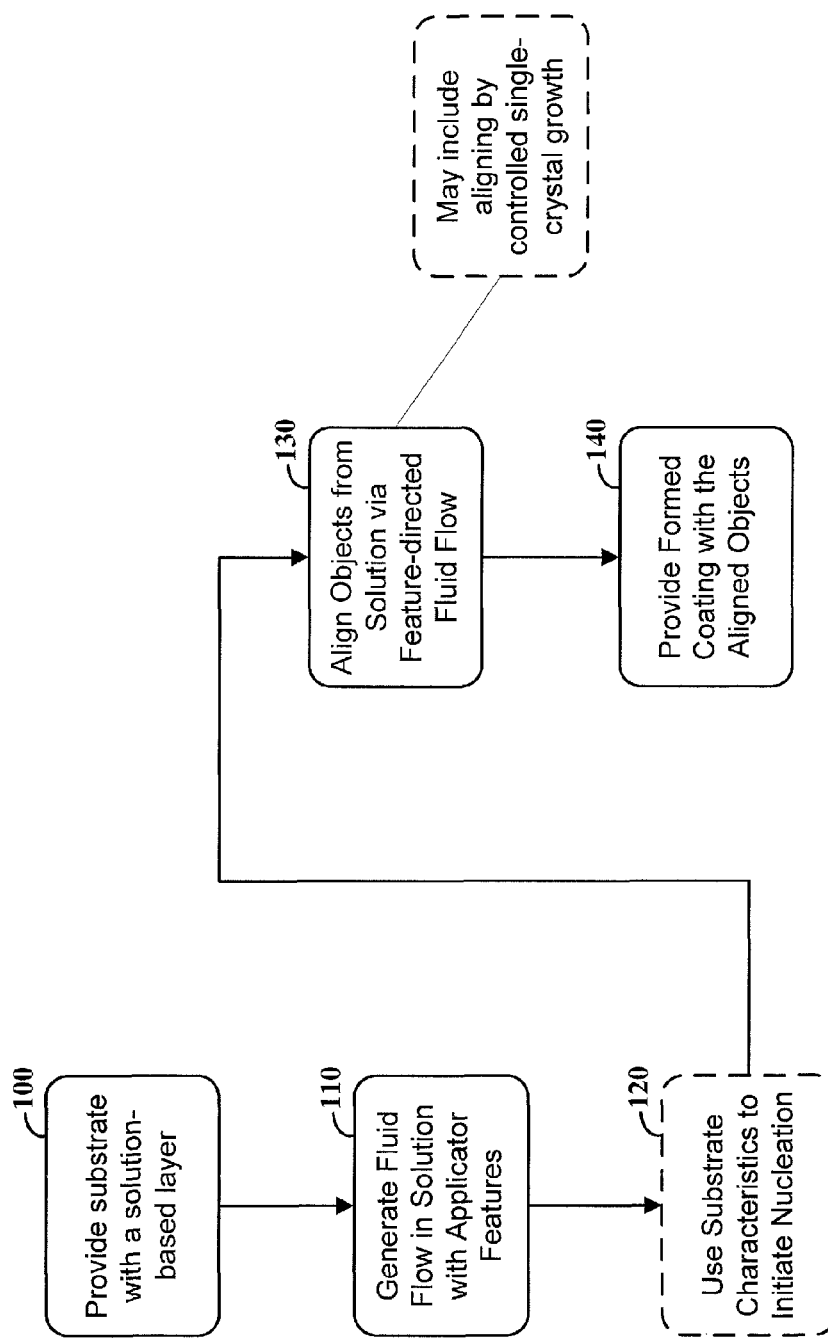
FIG. 1 shows a flow diagram for forming a thin film, in accordance with an example embodiment.

While various embodiments discussed herein are amenable to modifications and alternative forms, aspects thereof have been shown by way of example in the drawings and will be described in detail. It should be understood, however, that the intention is not to limit the invention to the particular embodiments described. On the contrary, the intention is to cover all modifications, equivalents, and alternatives falling within the scope of the disclosure including aspects defined in the claims. In addition, the term "example" as used throughout this application is by way of illustration, and not limitation.

DETAILED DESCRIPTION

Aspects of the present disclosure are believed to be applicable to a variety of different types of devices, systems and arrangements involving fluid-enhanced crystal-engineering that allows for a high degree of morphological control of solution-printed thin films. Certain aspects of the present disclosure utilize a micropillar patterned application structure (e.g., a blade) to induce recirculation in the ink for enhancing crystal growth. Additionally, in certain embodiments, the micropillar patterned application structure controls the curvature of the ink meniscus which controls crystal nucleation. Other embodiments and features are exemplified in the claims and in the appendices included in the underlying provisional application to which benefit is claimed.

Various aspects of the present disclosure are directed toward apparatus or methods, as exemplified or supported by the underlying description and further discussion in the provisional application to which benefit is claimed. The apparatus and methods involve a substrate, and a film provided on the substrate. The film includes a plurality of objects such as single-crystalline structures that have a high degree of alignment with respect to one other. Additionally, in various embodiments the width of the individual structures is greater than approximately 50 µm.

In certain embodiments, each of the plurality of single-crystalline structures has a width at least between 200 µm and 1 mm. Additionally, certain embodiments of apparatus and methods, consistent with the present disclosure, also include a nucleation control pattern provided on the substrate. The nucleation control pattern assists in alignment of the plurality of single-crystalline structures. Additionally, as seen in the figures, a high degree of alignment of the plurality of single-crystalline structures can be characterized by the plurality of single-crystalline structures being at least 20 degrees or 30 degrees in the same direction. Further, in other embodiments, the high degree of alignment is characterized by the plurality of single-crystalline structures being within 10 degrees of a parallel axis of the substrate. In order to determine whether the single-crystalline structures are highly aligned, cross-polarized light is directed at the substrate and film, and if the domains of the plurality of single-crystalline structures extinguish at the same time, there is a high degree of alignment.

In certain embodiments, the film is provided to the substrate by applying a solution using an applicator that has a plurality of fluid-mixing structures (e.g., pillars, concave structures, microfluidic channels). In this manner, the plurality of fluid-mixing structures provides a single-crystalline film having high degree of alignment. Additionally, in other embodiments, the film is a highly controlled structure, with a crystalline size, and alignment is produced by applying a solution to the substrate using an applicator including a plurality of fluid-mixing structures. Further, the film can also be provided by applying a solution to the substrate using an applicator including a plurality of fluid-mixing structures to induce and control a concentration of the solution distributed throughout the film. The solution can be applied with the substrate being at a controlled temperature. Additionally, the film is often applied to the substrate at a controlled shearing speed.

In certain embodiments, the plurality of fluid-mixing structures provided with the applicator is between 1 µm and 1 mm in height or depth. Additionally, in other embodiments, each of the plurality of fluid-mixing structures is separated by a pitch distance between 50 nm and 1 mm. Further, the plurality of fluid-mixing structures can be separated by a pitch distance that is approximately equal to the height of the plurality of fluid-mixing structures.

In certain embodiments, applying the film to the substrate includes inducing recirculation of the solution near a drying front of the solution, and in other embodiments still, applying the film to the substrate includes controlling a curvature of the solution meniscus. Additionally, in certain embodiments, utilizing fluid-mixing structures on an applicator to apply the film to the substrate decreases mass depletion regions in the single-crystalline film. In certain more specific embodiments, in applying the film to the substrate, an applicator (having a plurality of fluid-mixing structures) is advanced along the substrate at a height above the substrate that is approximately equal to the height of the plurality of fluid-mixing structures.

Various embodiments of the present disclosure are also directed toward application of a solution to a substrate, which results in a film on the substrate having a plurality of single-crystalline structures each of which has a high degree of alignment with respect to the other single-crystalline structures. The film can be provided using a number of difference processes, including, for example a slot-die coater, or a roll-to-roll processing technique.

Various embodiments may be implemented in conjunction with different types of apparatuses. For instance, some embodiments are directed to a thin film used in electronic applications, such as in bulk heterojunction solar cells, touch screens, organic devices and electrodes as may be implemented in a multitude of electrical applications.

In some embodiments, a micropillar patterned printing blade is used to induce recirculation in the ink for enhancing crystal growth, with the curvature of the ink meniscus used to control crystal nucleation. Fast coating and patterning of millimeter-wide, centimeter-long, highly-aligned single-crystalline organic semiconductor thin films can be achieved. For instance, thin films of 6,13-bis(triisopropyl-silylethynyl) pentacene (TIPS-pentacene) can be formed having lattice-strained single-crystalline domains and average and maximum mobilities of $8.1 \pm 1.2$ cm2 V-1 s-1 and 11 cm2 V-1 s-1, as may be implemented with non-equilibrium single-crystalline domains in high-performance, large-area printed electronics.

Various embodiments are directed to fluid flow-enhanced alignment of objects, such as objects from which crystals are grown (and, e.g., alignment of such as-grown crystals). These and other embodiments are implemented for controlling thin film morphology during coating of the film, such as coating involving solution shearing, for mitigating or preventing defects during film formation (e.g., for preventing crystalline defects). A component such as a blade or other tool is patterned with microstructures, such as micropillars, and engaged with the solution to enhance mass transport, such as by dragging or otherwise moving the microstructures through the film. This approach can address issues that may, for example, relate to laminar flow in micron-thick films (e.g., including ink), which may impose mass transport limitations and lead to undesirable conditions such as void formation and dendritic growth, and hinder efficient charge transport due to charge carrier trapping at prevalent grain boundaries. Enhancing mass transport in this regard can reduce or eliminate such aspects as void formation and dendritic growth, addressing charge carrier trapping issues.

The spacing and arrangement of the microstructures can be tailored to particular applications. In some embodiments, a spacing (period) between microstructures is less than 100 microns, or otherwise set to match a domain size in the reference film being prepared (the domain size being relevant to the film preparation without using microstructures). The cross-section and shape of the microstructures may also be set to suit particular embodiments in this regard. In some implementations, the microstructures are arranged to facilitate recirculation behind the microstructures as they move through the film. Narrow spacing can be implemented to induce rapid flow expansion following acceleration through the gap between the structures, so as to facilitate lateral mass transport (e.g., perpendicular to the shearing direction). This approach can be implemented with unidirectional coating techniques (e.g., solution shearing, slot-die printing, doctor blading, or zone casting), in which evaporation-driven connective flow occurs mainly along the blade/tool movement direction.

Another embodiment is directed to an apparatus including an applicator having one or more surfaces (e.g., top or bottom) patterned with features that protrude from or into the applicator. A coated substrate includes a solution-based layer of objects having features and morphology attributes (e.g., nano-sized, micron-sized, millimeter-sized or molecule level) that are attained as a function of the protruded or indented features. The objects may include, for example, small molecules, macromolecules, and nanoscale particulates, and can be inorganic, organic or inorganic/organic hybrid objects.

The patterned features are implemented in a variety of manners to suit particular embodiments. In some implementations, the features set the direction of the morphology attributes based on a fluidic mix of the objects in the coating. The shape, spacing and arrangement of the features may be controlled to set the resulting morphology.

The features and morphology attributes of the coated substrate are also set in various manners, to suit particular embodiments. In some embodiments, the coated substrate includes patterned features that control the flow of the solution and spatial distribution of the objects on the substrate. In certain embodiments, the objects include at least one of crystal-forming molecules and inorganic molecules, and the coated substrate includes patterned features that operate with the protruded or indented features of the applicator to control both nucleation and growth of crystalline structures from the objects. For instance, phase separation as relating to nucleation, growth of crystalline structures and/or spinodal decomposition from the objects can be used to control the objects. In some embodiments, the solution-based layer exhibits morphology attributes including domain size of respective objects in the coated film that are controlled with the protruded or indented features (e.g., for polymers, small molecules, inorganic materials, nano or micro-objects including one of particles, rods, wires, and tubes, or a combination of different ones of the types of objects). In some embodiments, the solution includes one or more of crystal-forming molecules, inorganic materials and other objects having a features including directed crystalline morphology attributes arranged by the protruded or indented features.

In certain embodiments, the substrate includes patterned features having boundary regions with intersecting edges that nucleate the objects along the boundary regions by directing flow of the objects in the solution and controlling evaporation of solvent from the solution (e.g., to pattern the solution-based layer relative to surface patterning on the substrate). For instance, the intersecting edges may be implemented to, as a meniscus of the solution-based layer passes an intersection of the edges, pin a contact line of the solution at the intersection of the edges until the objects nucleate at the contact line. In some implementations, the intersecting edges operate to evaporate solvent from the solution-based layer and deposit a crystalline or a non-crystalline coating on the substrate that includes ones of the objects that are dissolved or suspended in the solvent. The patterned features may, for example, facilitate deposition of a crystalline or a non-crystalline coating on the substrate by controlling evaporation of a solvent from the solution, in which the coating includes substances chemically derived from the objects that were dissolved or suspended in the solvent. In some implementations, the patterned features form the chemically-derived substances during or after coating of the substrate by at least one of chemical and thermal interaction with at least one of the applicator and the coated substrate.

Another embodiment is directed to forming a film including single-crystalline structures from a solution, upon a substrate having a nucleation control pattern. The structures are nucleated via the nucleation control pattern, and meniscus curvature and fluid flow are used to create aligned crystals. Using this approach, each structure has a nucleated crystalline lattice aligned with respect to others of the structures relative to the nucleation control pattern. For instance, aligned single-crystalline structures can be grown with a width of at least 50 µm while aligning the single-crystalline structures with a micropillar-patterned printing blade. Further, fluid-mixing structures of the blade can be used to decrease mass depletion regions in the solution, prior to nucleating the plurality of single-crystalline structures, induce microphase separation of the solution by increasing the nucleation density, and/or induce recirculation of the solution near a drying front thereof. In certain implementations, cross-polarized light is used to concurrently extinguish domains of the plurality of single-crystalline structures.

Another embodiment is directed to a plurality of substrate-grown single-crystalline structures arranged in a layer and with each of the structures having a nucleated crystalline lattice aligned with respect to others of the plurality of single-crystalline structures relative or corresponding to a nucleation control pattern. The substrate-grown single-crystalline structures exhibit alignment of the single-crystalline structures along the nucleation control pattern.

Turning now to the Figures, FIG. 1 shows a flow diagram for forming a thin film, in accordance with another example embodiment. At block 100, a substrate is provided with a solution-based layer. At block 110, fluid flow is generated in the solution-based layer, by introducing applicator features. For instance, protrusions or indentations of an applicator can be introduced into a substrate or other material of the applicator, and engage with the solution. Such features may, for example, have spacing and sizes that facilitate alignment. At block 120, characteristics of the substrate are optionally used to initiate nucleation, such as by pinning fluid flow to initiate nucleation of single-crystal structures. Other embodiments involve the alignment of non-crystalline structures. At block 130, objects from the solution are aligned, via the fluid flow as implemented by the applicator. This alignment may, for example, involve controlled single-crystalline growth, such as in embodiments in which bock 120 is implemented. At block 140, a formed coating is provided with the aligned objects, as may be used for a variety of devices such as thin-film electronic devices including those discussed in the underlying provisional application to which benefit is claimed.

Figure 2:
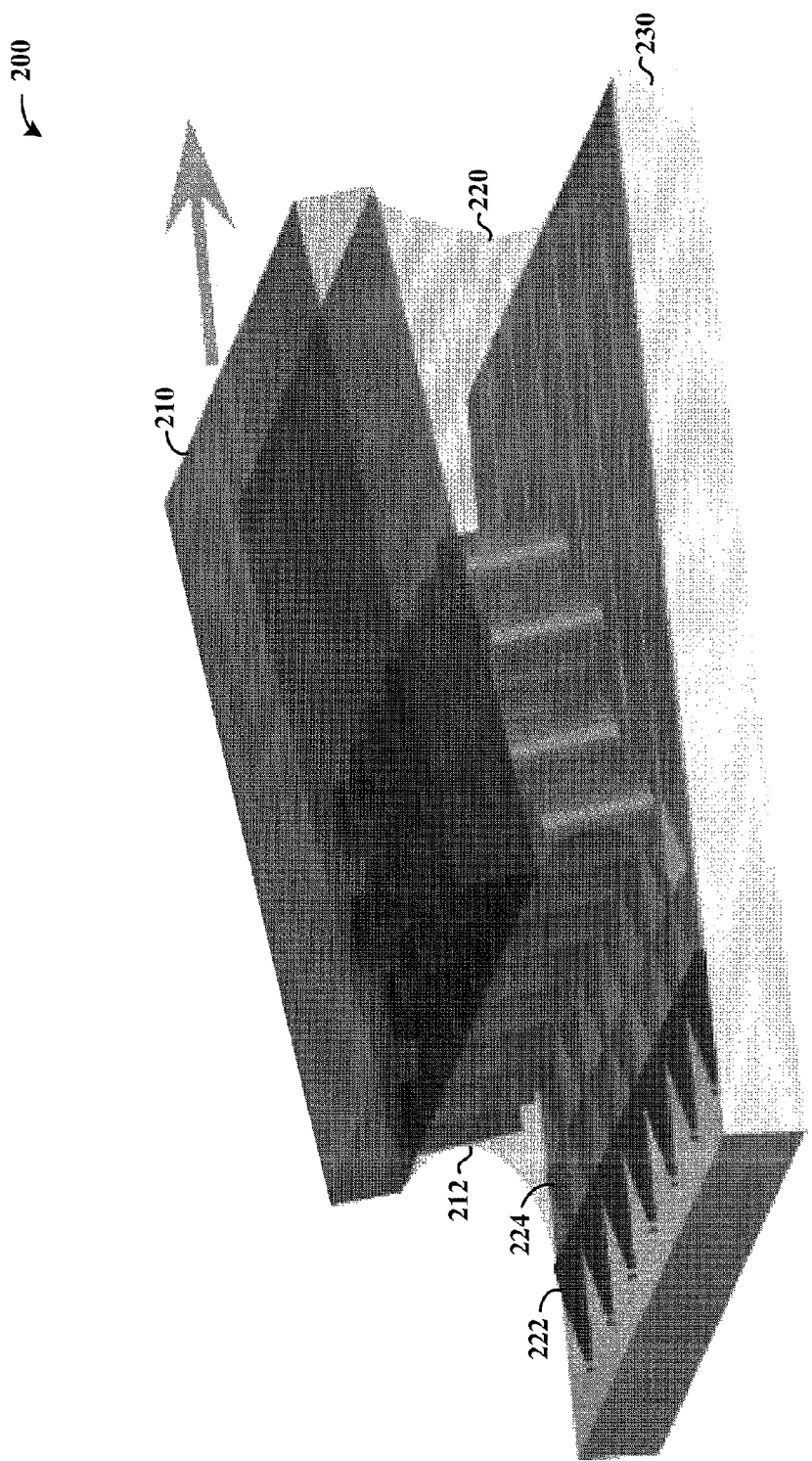
FIG. 2 shows an apparatus and approach to forming a film on a substrate, in accordance with another example embodiment.

FIG. 2 shows an apparatus and approach 200 to forming a film on a substrate, in accordance with another example embodiment. A tool 210 includes a plurality of microstructures, including microstructure 212 labeled by way of example, that interact with a coating 220 to form a film 222 on a substrate 230 (e.g., which may be heated by way of example). The microstructures are pulled through the film 222 in a direction as shown by the arrow, to mitigate defects in the formation of the film 222. For instance, by using microstructures patterned in a manner that enhances mass transport in the film, defects can be reduced or eliminated.

Figure 3:
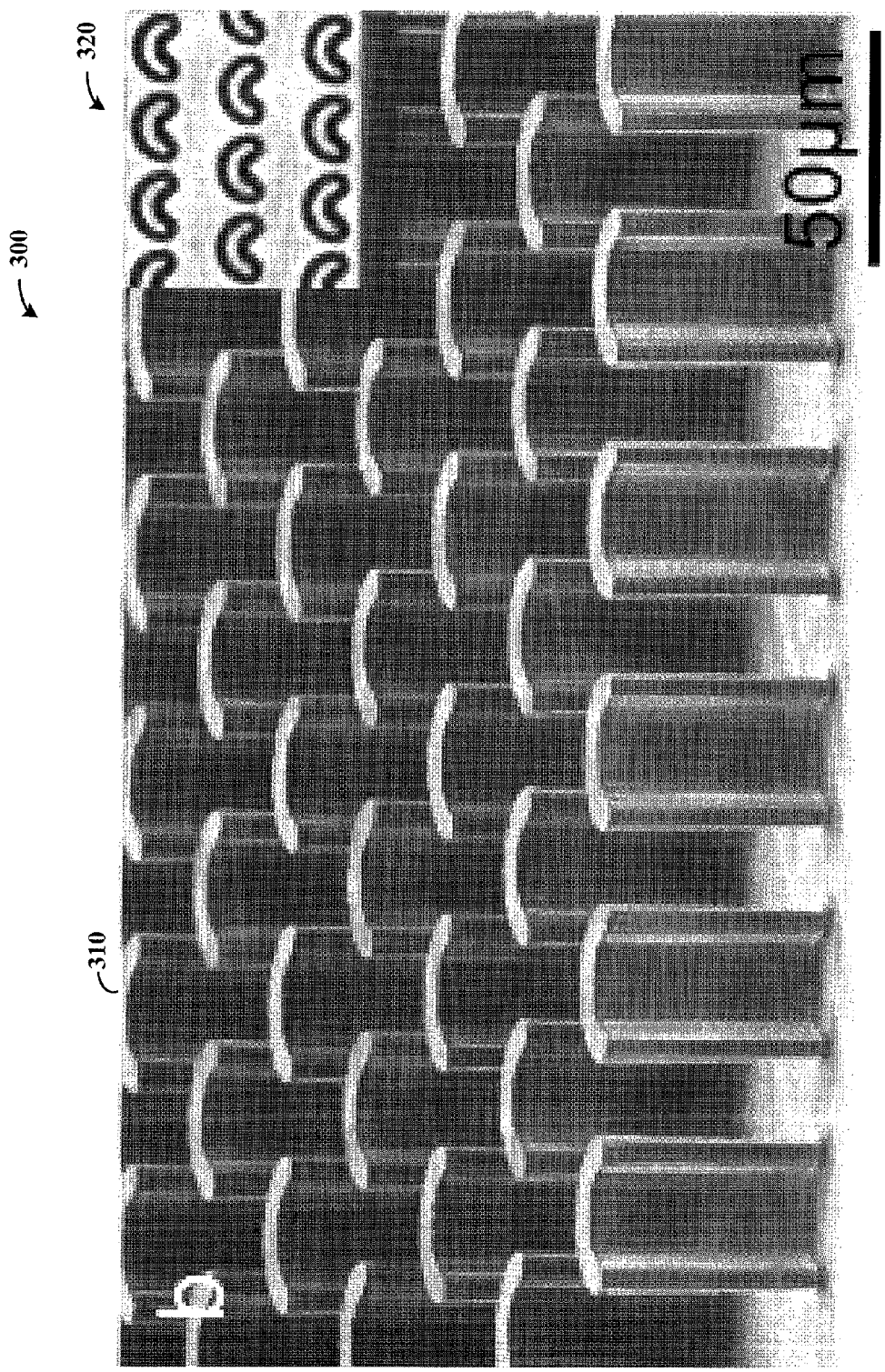
FIG. 3 shows a microstructure arrangement, in accordance with another example embodiment.

FIG. 3 shows a microstructure apparatus 300, in accordance with another example embodiment. The microstructure apparatus 300 includes a plurality of microstructures (e.g., micropillars), with an example size reference and microstructure 310 labeled by way of example. Inset 320 shows a top view of the microstructures. A cross-section of the microstructures is crescent-shaped, and can be implemented with the arch of each microstructure being directed against a flow direction of fluid through which the apparatus is drawn, to facilitate flow separation from the surface of the microstructures. The microstructures operate to generate recirculation behind the microstructures. The narrow microstructure spacing induces rapid flow expansion following acceleration through the gap between the microstructures, so as to facilitate lateral mass transport (perpendicular to the shearing direction). This approach may be implemented with unidirectional coating techniques such as solution shearing, slot-die printing, doctor blading, and zone casting, in which evaporation-driven connective flow occurs mainly along the blade movement direction.

Figure 4:
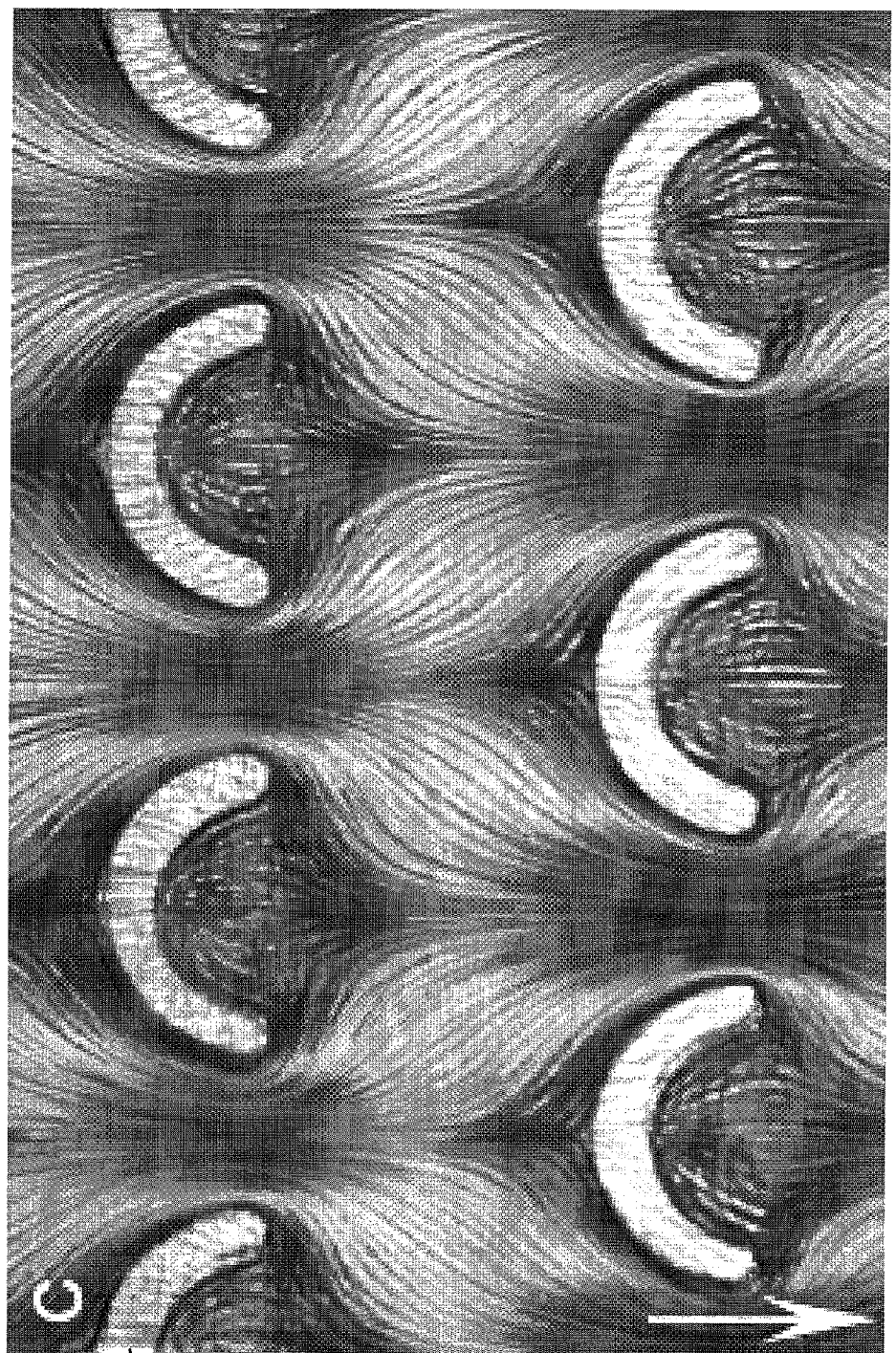
FIG. 4 shows flow patterns in a film as microstructures are moved in the film, in accordance with another example embodiment.

FIG. 4 shows a microstructure apparatus 400 and corresponding flow patterns in a film as the microstructures are moved in the film, in accordance with another example embodiment. The apparatus 400 may, for example, be implemented in accordance with the apparatus 300 shown in FIG. 3. Microstructure 410 is labeled by way of example, with flow lines shown passing around the crescent-shape of the microstructures, which generate recirculation and lateral currents behind the pillars. There is little to no velocity in flow in front of and behind the crescent-shape, with high velocity (e.g., 1.3 mm/s) laterally between the microstructures, with flow direction shown by the arrow.

The use of microstructures, such as micropillar-patterned shearing blades as may be consistent with the apparatus 300 in FIG. 3, can significantly improve thin-film morphology of various types of objects in solution. In some embodiments, TIPS-pentacene is sheared from its mesitylene solution to form crystalline structures having a domain size on the millimeter scale, with drastically reduced grain boundary densities (e.g., relative to such structures formed without such a shearing blade). This approach can be implemented to produce structures with a low void fraction and virtually no dendritic growth. In some embodiments, the micropillars of about 35 μm wide and 42 μm tall are used to effect these flow characteristics.

In some embodiments, single-crystalline domains are achieved by controlling fluid mixing and also controlling the nucleation process of crystalline structures in the fluid. This entails controlling the spatial distribution and the density of nucleation events, by controlling solvent evaporation. In some embodiments, the curvature of a contact line is modified by surface patterning of a substrate upon which the film is formed, to anchor nucleation at spots where the radius of curvature is the highest in which crystal nucleation preferentially occurs at highly convex points along the contact line. The shape of the contact line is modulated by patterning the substrate with solvent-wetting and non-wetting regions, using a combination of photolithography and surface energy patterning (e.g., using PTS (phenyltrichlorosilane) and crystalline OTS (octadecyltrichlorosilane) to create the wetting and non-wetting regions, respectively).

Referring again to FIG. 2, in some implementations, the substrate 230 is patterned with wetting regions including triangular-shaped portions including portion 224, which facilitates crystallization. The tip of the triangular regions points towards the approaching meniscus of the coating 220 (e.g., ink). As the meniscus passes, the contact line is temporarily pinned at the boundary of the triangles, until nucleation occurs at the sharp tips. The triangular design defines a wedge shaped meniscus that funnels the convective supply of solute towards the tip, which facilitates nucleation anchoring by lowering the nucleation induction time. In some implementations, asymmetric aspects of the triangle portions eliminate twin boundary formation. Following the triangles is a series of narrow slits that arrest the growth of undesired crystallites, which are otherwise difficult to eliminate simply by nucleation control given the stochastic nature of nucleation.

In certain embodiments, a fluid-enhanced crystal engineering approach involves controlling both nucleation and crystal growth. In certain implementations, millimeter-wide, centimeter-long TIPS-pentacene single-crystalline domains are formed using a combination of fluid flow and surface-based nucleation control. Resulting domains may, for example, extinguish cross-polarized light simultaneously, indicating a high degree of crystallographic alignment. Single-crystalline domains coated using this approach may exhibit a smooth and uniform texture, with minimal voids. In some implementations, the number of voids is reduced by increasing film thickness or lowering coating speed.

Such approaches are applicable to large-area, high-throughput coating with controlled domain locations. In some implementations, an array of large TIPS-pentacene single crystalline domains is formed covering an area of approximately 1×3 $cm^2$ within 50 seconds, with a high probability (e.g., 70%) of forming single crystals. In other implementations, a probability of single-crystal formation is increased to above 90% by narrowing domains to 500 μm and 200 μm in width, reducing surface defects (e.g., by tuning a slit as discussed above), while maintaining the same printing speed.

Figure 5:
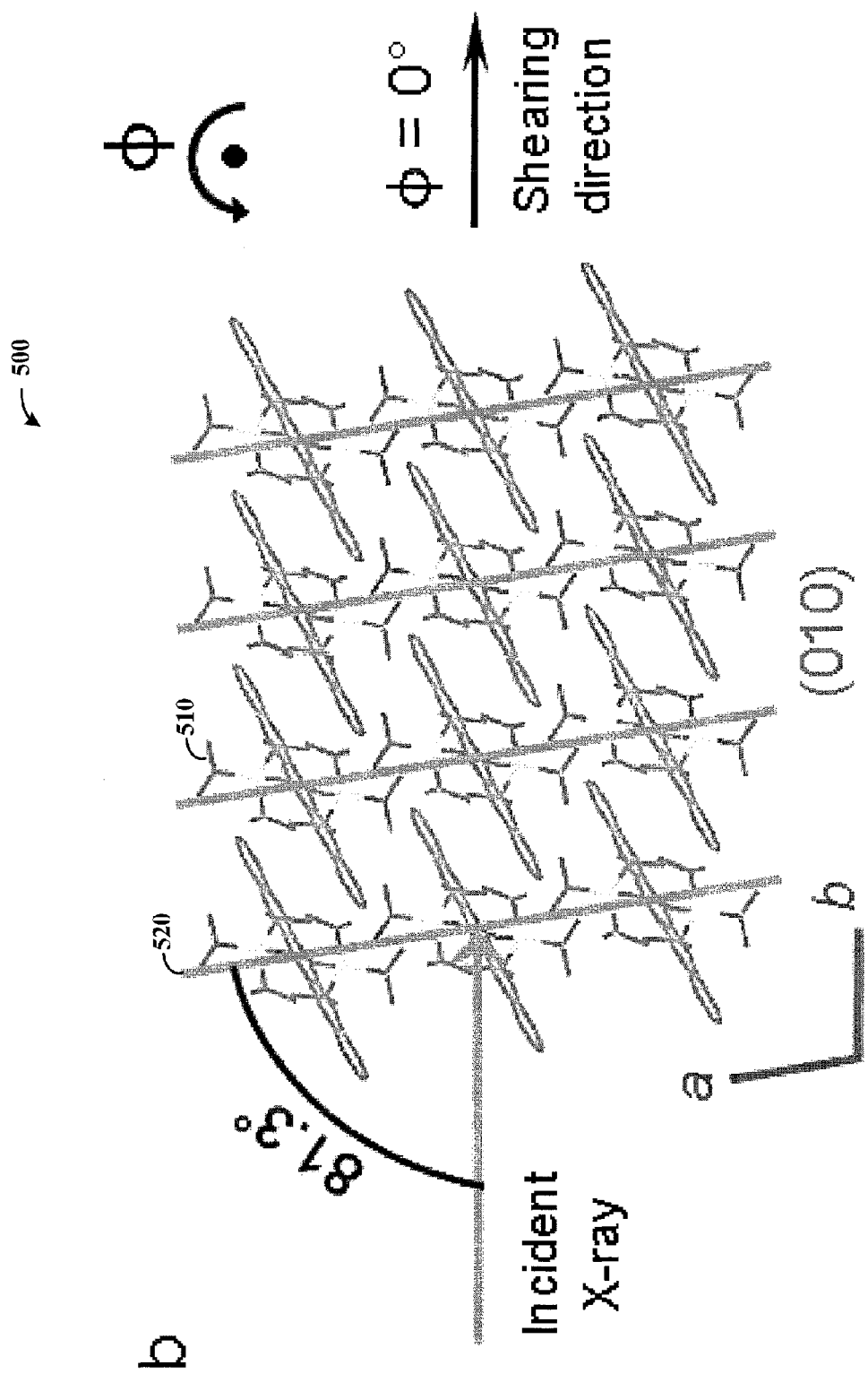
FIG. 5 shows structures aligned via a an applicator, in accordance with another example embodiment.

FIG. 5 shows an apparatus 500 having structures (including structure 510) aligned via an applicator, in accordance with another example embodiment. The structures include in-plane molecular structure of TIPS-pentacene crystal with a b-axis aligned with the shearing direction, at $\varphi=0°$ as shown. The overall grain orientation distribution and the dominant crystal growth axis are shown on the (010) reflection (along line 520 and lines parallel thereto) with the momentum transfer vector $q_{xy}=0.81$, $q_z=0.21$. This reflection may be used for comprehensive sampling, since at the corresponding diffraction condition, the X-ray illuminates all grains almost perpendicularly to the shearing direction. Phi-scans confirm the high degree of alignment of single-crystalline domains, with an angular spread of diffraction peaks of about 3 degrees (around) $\varphi=80°$). The (010) diffraction peak may be at $\varphi=81.3°$ when the b axis of TIPS-pentacene is perfectly aligned with the shearing direction ($\varphi=0°$). The crystallographic b axis of the TIPS-pentacene is aligned with the shearing direction, within sample placement error. This crystal orientation may be implemented to enhance charge transport. Further, these approaches can be similarly used with materials other than TIPS-pentacene.

In various applications as implemented with FIG. 5, out-of-plane coherence lengths can be set at 16±2 nm, by imparting a common out-of-plane molecular packing throughout almost the entire thickness of the film. The single-crystalline domains are formed with in-plane correlation lengths both parallel and perpendicular to the shearing direction. The correlation length perpendicular to the shearing direction can be increased by enhancing mass transport in the lateral direction (e.g., using a micropillar-patterned blade such as shown in FIG. 2).

In some implementations, crystal morphology is controlled while tuning molecular packing of crystalline materials such as TIPS-pentacene, to optimize the charge carrier mobility. Non-equilibrium molecular packing states are achieved by tuning film thickness and solvent. In some implementations, multiple polymorphs of crystalline material are formed with incremental changes in unit cell geometry relative to equilibrium, with non-equilibrium packing states achieved via confined molecular motion near the substrate. For instance, by taking advantage of the thickness-dependent molecular packing, non-equilibrium crystal lattices can be achieved by lowering solution concentration instead of increasing shearing speed, thereby maintaining film morphology while tuning molecular packing. In some implementations involving TIPS-pentacene, it has been recognized/discovered that the solvent mesitylene can be used to obtain non-equilibrium molecular packing of TIPS-pentacene at lower shearing speed (e.g., relative to using toluene).

Various embodiments are directed to solution coating of various soluble organic compounds, addressing mass-transport limited crystal growth and random nucleation in high-throughput crystalline film formation. For instance, such morphology control can be applied to an organic semiconductor molecule, 4T-TMS (trimethylsilyl-substituted quarterthiophene) to form single-crystalline thin films of 4T-TMS that exhibit a herringbone packing motif.

Figure 6:
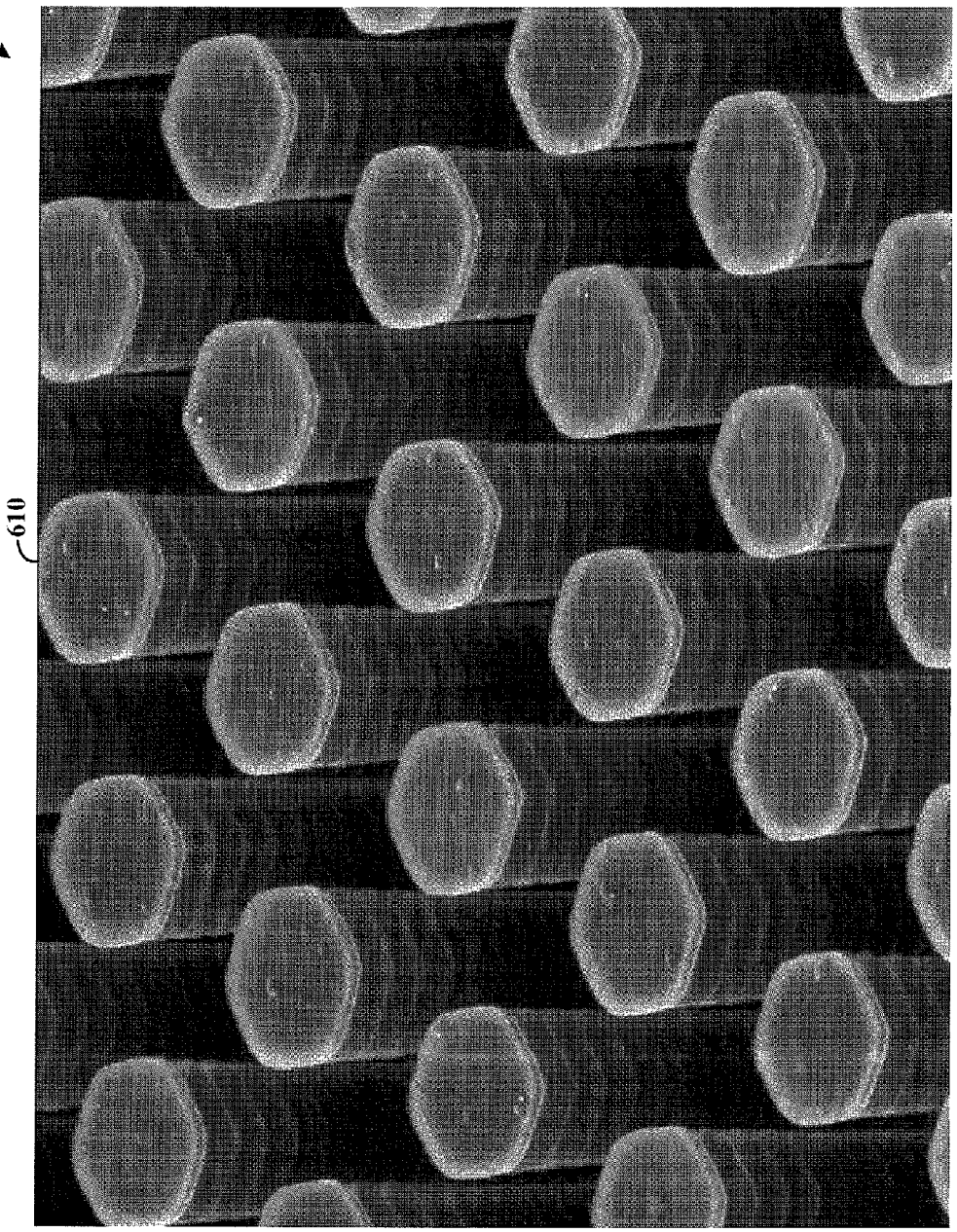
FIG. 6 shows patterned microstructures, in accordance with another example embodiment.

FIG. 6 shows patterned microstructures 600, in accordance with another example embodiment. A plurality of hexagonal-shaped microstructures, including microstructure 610, are shown in a pillar formation. These pillars may be used in an array, such as with an applicator as shown in FIG. 2 (e.g., in place of and/or in addition to the crescent-shaped structures as shown therein). In some embodiments, the microstructure 610 has a diameter of 2-3 μm, a height of 6 μm (AR: 2~3), and a spacing length between the structures of 1.5~2 μm (spacing ratio: 0.5~1).

The embodiments and specific applications discussed herein and in the above-referenced provisional application may be implemented in connection with one or more of the above-described aspects, embodiments and implementations, as well as with those shown in the appended figures. One or more of the items depicted in the present disclosure and in the provisional application to which benefit is claimed can also be implemented in a more separated or integrated manner, or removed and/or rendered as inoperable in certain cases, as is useful in accordance with particular applications. In view of the description herein, those skilled in the art will recognize that many changes may be made thereto without departing from the spirit and scope of the present disclosure.

What is claimed is:

1. An apparatus comprising:
an applicator including a shearing blade having at least one surface patterned with protruded or indented features; and
a coated substrate including a solution-based layer of objects having a plurality of features and morphology attributes including at least one of nano-sized, micron-sized, millimeter-sized and molecule level, being configured and arranged as a function of the protruded or indented features, wherein the protruded or indented features of the applicator are separated by a pitch distance of between 50 nm and 1 mm such that application with the solution causes formation of a film on the substrate having the plurality of features and morphology attributes.

2. The apparatus of claim 1, wherein the features are configured and arranged to set the direction of the morphology attributes based on a fluidic mix of the objects in the coating, and wherein the attributes include nano-sized objects.

3. The apparatus of claim 1, wherein the coated substrate includes patterned features configured and arranged to control flow of the solution and spatial distribution of the objects on the substrate and wherein the attributes include micron-sized objects.

4. The apparatus of claim 1, wherein
the objects include at least one of crystal-forming molecules and inorganic molecules, and
the coated substrate includes patterned features that are configured and arranged with the protruded or indented features of the applicator to control both nucleation and growth of crystalline structures from the objects.

5. The apparatus of claim 1, wherein the solution-based layer exhibits the morphology attributes including domain size of respective objects in the solution-based layer that are configured and arranged as a function of the protruded or indented features, wherein types of the objects include at least one of:
polymers,
small molecules,
inorganic materials,
nano or micro-objects including one of particles, rods, wires, and tubes, and
a combination of different ones of the types of the objects.

6. The apparatus of claim 1, wherein the solution-based layer includes a solution of at least one of crystal-forming molecules, inorganic materials and other objects having a plurality of features including directed crystalline morphology attributes configured and arranged as a function of the protruded or indented features.

7. The apparatus of claim 1, wherein
the objects include at least one of crystal-forming molecules, inorganic molecules and other objects, and
the substrate includes patterned features having boundary regions with intersecting edges configured and arranged to nucleate the objects along the boundary regions by directing flow of the objects in the solution and controlling evaporation of solvent from the solution.

8. The apparatus of claim 7, wherein the intersecting edges are configured and arranged to, as a meniscus of the solution-based layer passes an intersection of the edges, pin a contact line of the solution at the intersection of the edges until the objects nucleate at the contact line.

9. The apparatus of claim 7, wherein the solution-based layer is patterned relative to surface patterning on the substrate.

10. The apparatus of claim 7, wherein the intersecting edges are configured and arranged to facilitate evaporation of a solvent from the solution-based layer and therein deposit a crystalline or a non-crystalline coating on the substrate, the coating including ones of the objects that are dissolved or suspended in the solvent.

11. The apparatus of claim 7, wherein the patterned features are configured and arranged to facilitate deposition of a crystalline or a non-crystalline coating on the substrate by controlling evaporation of a solvent from the solution, and wherein the coated substrate includes substances chemically derived from the objects that were dissolved or suspended in the solvent.

12. The apparatus of claim 11, wherein the patterned features are configured and arranged to form the chemically-derived substances during or after coating of the substrate by at least one of chemical and thermal interaction with at least one of the applicator and the coated substrate.

13. The apparatus of claim 1, wherein
the objects include at least one of crystal-forming molecules and inorganic molecules, and
the coated substrate includes patterned features that are configured and arranged with the protruded or indented features of the applicator to control phase separation including at least one of nucleation, growth of single crystalline structures and spinodal decomposition from the objects.

14. The apparatus of claim 1, wherein the coated substrate includes directed or aligned crystalline morphology attributes set as a function of the protruded or indented features.

15. The apparatus of claim 1, wherein the morphology attributes includes shape and distances between the protruded or indented features being configured and arranged to control flow of fluid in the solution-based layer, and using the controlled flow of fluid to orient the objects.

16. The apparatus of claim 1, further including patterned features on the substrate being configured and arranged to control nucleation of crystalline structures from the objects by controlling evaporation of solvent from the solution-based layer.

17. The apparatus of claim 1, further including reactive components present during deposition or post deposition of the solution-based layer.

18. The apparatus of claim 1, wherein the shearing blade has a micro-pillar pattern formed by the protruded or indented features.

19. The apparatus of claim 1, wherein the protruded or indented features are configured to interact with the solution to form a film on the substrate responsive to movement of the applicator relative to the coated substrate or movement of the coated substrate relative to the applicator.

20. The apparatus of claim 1, wherein the protruded or indented features include pillars or indented pillar shapes in an array, each protruded or indented features having a height or depth of between 1 um and 1 mm.

* * * * *